Jan. 27, 1970 H. KNAU ET AL 3,491,435

PROCESS FOR MANUFACTURING HEADERLESS
ENCAPSULATED SEMICONDUCTOR DEVICES
Filed May 25, 1966

INVENTORS.
HORST KNAU
VALENTIN MOLL
DIETER SAUTTER

BY [signature]
ATTORNEY

United States Patent Office 3,491,435
Patented Jan. 27, 1970

3,491,435

PROCESS FOR MANUFACTURING HEADERLESS ENCAPSULATED SEMICONDUCTOR DEVICES

Horst Knau, Gundelfingen, Valentin Moll, Freiburg, and Dieter Sautter, Gundelfingen, Germany, assignors to International Standard Electric Corporation, New York, N.Y., a corporation of Delaware Filed May 25, 1966, Ser. No. 552,876
Claims priority, application Germany, June 1, 1965, J 28,250
Int. Cl. H05k *3/00*
U.S. Cl. 29—588 6 Claims

ABSTRACT OF THE DISCLOSURE

This is a process for mass producing semiconductor devices. Each of a plurality of semiconductor wafers are mounted on one of a group of conductive leads which extend from a sheet metal member. The first conductive lead is directly connected to the collector electrode while the base and emitter electrodes are connected to adjacent conductive leads by soldered leads. The wafer and adjacent portions of the conductive leads are immersed in encapsulating material and the device is encapsulated. The conductive leads are then severed from the sheet metal member to yield a finished device.

The present invention is directed to a process for manufacturing semiconductor devices and particularly to a process wherein such devices may be manufactured in large quantities at low cost.

Conventional techniques for manufacturing semiconductor devices involve the steps of (1) first processing a mass of semiconductor material to, e.g., obtain regions of various conductivity types within such mass, (2) forming electrodes to these various regions, (3) mounting the mass of semiconductor material on a suitable header and connecting the electrodes to various leads extending through the header, and (4) applying a suitable casing over the semiconductor mass, the casing forming a seal with the header.

It has been found that where such conventional techniques are employed the costs of procuring the header, of mounting the semiconductor device thereon, and of applying the casing represent on the order of 90% of the manufacturing cost of the completed semiconductor device. In order to reduce the manufacturing cost, it has been known to encapsulate the header-mounted semiconductor device rather than to apply a standard casing thereto. Techniques are also known for providing headerless semiconductor devices which are encapsulated. However, these heretofore known techniques are applicable primarily to manual manufacturing operations and do not readily lend themselves to low cost mass production techniques.

The present invention relates to a novel technique for manufacturing semiconductor devices requiring neither a header nor a casing therefor, and is especially adaptable to automatic assembly line mass production techniques.

Accordingly, an object of the present invention is to provide a process for the manufacture of low cost semiconductor devices having neither headers nor casings.

Another object of the invention is to provide such a low cost manufacturing process in a form readily adaptable to automatic mass production assembly line techniques.

Figure 1:
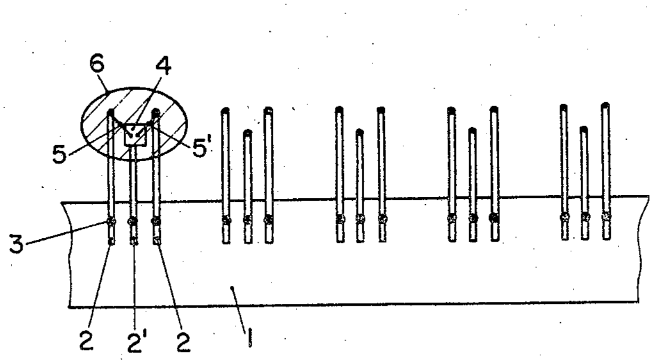
Figure 2:
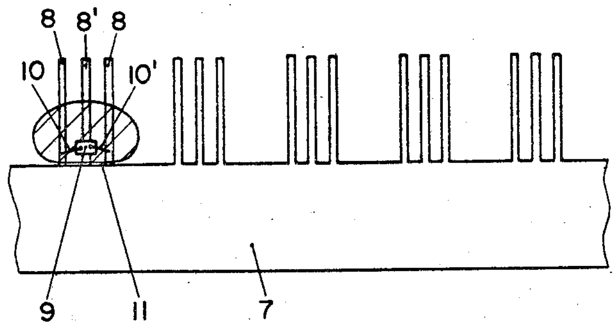

These and other objects and advantages of the invention will become more apparent from the following detailed description taken in conjunction with the accompanying drawings, in which FIGS. 1 and 2 show two different embodiments of the invention.

FIG. 1 shows a sheet metal member 1 having a plurality of groups of conductive leads 2 and 2′ welded or soldered thereto. A transistor 4 having regions of various conductivity types with corresponding electrodes associated therewith is first mounted on the central conductive lead 2′ of a selected group. Electrical connections are then made between each of the associated electrodes of the transistor 4 and corresponding conductive leads of the group. The transistor 4 as shown in FIG. 1 contains a collector electrode on the bottom surface thereof and base and emitter electrodes on the top surface thereof. Transistor 4 is mounted to the central conductive lead 2′ of the group by means of a solder connection so that this lead is electrically connected to the collector of the transistor.

A short wire 5 is soldered at one end to the base electrode of the transistor and at the other end to a selected conductive lead of the group. Similarly, a short wire 5′ is soldered at one end to the emitter electrode of the transistor and at the other end to another selected lead of the group. The various leads 2 and 2′ of the group may be of equal or different length to facilitate the making of electrical connections to the transistor 4.

The conductive leads are then partially immersed in a suitable solution of encapsulating material (e.g. a resin or plastic composition) by proper location of the sheet metal member 1 with respect to the solution. It is also possible, as an alternative encapsulating technique, to employ suitable low melting glasses or to utilize die casting or injection molding methods.

The conductive leads are then removed from the encapsulating solution and the encapsulant 6 is allowed to harden. The conductive leads 2 and 2′ are then severed from the sheet metal member 1 to yield the finished semiconductor device.

FIG. 2 illustrates an alternative embodiment of the invention wherein the conductive leads 8 and 8′ and the sheet metal member 7 are stamped as a unitary mass. The transistor 9 is mounted on the central conductive lead 8′ as previously described. However, the mounting point is shown adjacent to the sheet metal member 7 in order to reduce undesirable stresses due to the mass of the transistor. A short wire 10 is soldered at one end to the base electrode of the transistor and at the other end to a selected conductive lead of the group. Similarly, the wire 10′ is soldered at one end to the emitter electrode of the transistor and at the other end to another selected conductive lead of the group. Subsequent encapsulation 11 and severing operations are identical to those employed in conjunction with the alternative embodiment shown in FIG. 1.

The comb-like structure employed in conjunction with the process invented by the applicants is readily adaptable to mass production techniques, since handling of the individual transistors 4 is not required after they have been mounted to corresponding conductive leads of their respective groups. All subsequent handling may be automatic by suitable manipulation of sheet metal member 1.

While the principles of the invention have been described above in connection with specific embodiments, and particular modifications thereof, it is to be clearly understood that this description is made only by way of example and not as a limitation on the scope of the invention.

What is claimed is:

1. A process for manufacturing a plurality of semiconductor devices, each of said devices having at least two electrodes associated therewith, comprising the steps of:

forming a member having a plurality of groups of substantially parallel conductive leads extending out in comb-like fashion from a support ridge;

mounting each semiconductor device on a portion of a given central lead of a corresponding group adjacent said support ridge so as to minimize the stress on said member caused by the mass of said device;

electrically connecting at least one associated electrode of each semiconductor device to a selected lead of said corresponding group;

encapsulating each of said mounted semiconductor devices; and severing said conductive leads from said member.

2. A process according to claim 1, wherein said encapsulating step includes immersing at least a portion of each of said given leads in an encapsulating composition.

3. A process according to claim 1, wherein the number of electrodes associated with each of said semiconductor devices is equal to the number of conductive leads in each of said corresponding groups.

4. A process according to claim 1, wherein said conductive leads are of substantially equal length.

5. A process according to claim 1, wherein said number comprises a unitary comb-like structure of sheet metal.

6. A process according to claim 2, wherein said electrical connections to said selected leads are encapsulated.

References Cited

UNITED STATES PATENTS

| | | | |
|---|---|---|---|
| 3,121,279 | 2/1964 | Van Hoof et al. | 29—627 |
| 3,171,187 | 3/1965 | Ikeda et al. | 29—574 |
| 3,264,712 | 8/1966 | Hayashi et al. | 29—589 |
| 3,271,625 | 9/1966 | Caracciolo | 317—101 |
| 3,281,628 | 10/1966 | Bauer | 29—588 X |
| 3,341,649 | 9/1967 | James | 29—588 X |
| 3,080,640 | 3/1963 | Jochems | 29—591 |
| 3,176,191 | 3/1965 | Rowe | 29—589 |
| 3,264,715 | 8/1966 | Siebertz | 29—630 |

PAUL M. COHEN, Primary Examiner

U.S. Cl. X.R.

29—577, 589, 624, 627; 317—234